United States Patent
Rupp

(10) Patent No.: US 7,015,702 B2
(45) Date of Patent: Mar. 21, 2006

(54) METHOD FOR EVALUATING A MEASURING SIGNAL AND CORRESPONDING CIRCUIT ARRANGEMENT

(75) Inventor: Jürgen Rupp, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 97 days.

(21) Appl. No.: 10/467,630

(22) PCT Filed: Feb. 6, 2002

(86) PCT No.: PCT/DE02/00433

§ 371 (c)(1),
(2), (4) Date: Aug. 8, 2003

(87) PCT Pub. No.: WO02/065142

PCT Pub. Date: Aug. 22, 2002

(65) Prior Publication Data

US 2004/0061506 A1 Apr. 1, 2004

(30) Foreign Application Priority Data

Feb. 9, 2001 (DE) ............................... 101 05 982

(51) Int. Cl.
*G01R 27/02* (2006.01)
*G01R 31/08* (2006.01)
(52) U.S. Cl. .................. 324/607; 324/609; 324/522
(58) Field of Classification Search ............... 324/522, 324/523, 118, 119, 607, 605, 603, 609; 340/310.01, 340/310.02, 310.06, 310.07
See application file for complete search history.

(56) References Cited

U.S. PATENT DOCUMENTS

| 4,086,805 A | * | 5/1978 | Kinderling et al. | 374/107 |
| 4,816,743 A | * | 3/1989 | Harms et al. | 324/727 |
| 5,036,444 A | * | 7/1991 | Hiles | 362/188 |
| 5,210,501 A | * | 5/1993 | Schneider et al. | 324/720 |
| 6,114,947 A | | 9/2000 | Tondorf | 340/310.08 |
| 6,133,743 A | * | 10/2000 | Gleixner et al. | 324/683 |
| 2004/0160229 A1 | * | 8/2004 | Fujita et al. | 324/607 |

FOREIGN PATENT DOCUMENTS

| DE | 19711218 | | 4/1998 |
| DE | 19910755 | | 10/1999 |
| FR | 2541777 | * | 8/1984 |

OTHER PUBLICATIONS

National Semiconductor; www.Power.National.Com, no date.

* cited by examiner

*Primary Examiner*—Anjan Deb
*Assistant Examiner*—Jeff Natalini
(74) *Attorney, Agent, or Firm*—Harness, Dickey & Pierce, P.L.C.

(57) ABSTRACT

In order to measure the current in a shunt, the voltage drop in the resistor of said shunt is evaluated as a measurement of the current. Normally, galvanic separation of the measuring device is required for high-potential shunts. A digital measuring signal provides the clock pulse for modulation of the supply current for the measuring device after an A/D conversion. The modulated supply current is also used as a carrier for the measuring information. In the associated evaluation device, an A/D converter and a modulation unit are arranged downstream from an amplifier for voltage signal which is picked off from the shunt. The modulated measuring signal is transmitted to an evaluation device.

31 Claims, 2 Drawing Sheets

METHOD FOR EVALUATING A MEASURING SIGNAL AND CORRESPONDING CIRCUIT ARRANGEMENT

This application is the national phase under 35 U.S.C. § 371 of PCT International Application No. PCT/DE02/00433 which has an International filing date of Feb. 6, 2002, which designated the United States of America and which claims priority on German Patent Application number DE 101 05 982.5 filed Feb. 9, 2001, the entire contents of which are hereby incorporated herein by reference.

FIELD OF THE INVENTION

The invention generally relates to a method for evaluation of a measurement value. The invention also generally relates to the associated circuit arrangement for carrying out the method. Preferably, it relates to a circuit arrangement for use for current measurement on a shunt for example, in which the voltage drop is evaluated as a measure of the current.

BACKGROUND OF THE INVENTION

Especially for current measurement, it is normal to use a shunt, which is essentially in the form of a defined resistance. It is normal to indicate the voltage drop across this resistance as the current value. A shunt such as this is frequently at a potential higher than ground potential.

Current measurement on a shunt which is at a potential is known. The LM 3822 module from the National Semiconductor Company produces a PWM signal after analog/digital conversion, for current measurement (see Internet www.Power.National.com).

When a shunt such as this is at high potential, DC isolation is generally specified for further processing of the measurement signals. Optocouplers, for example, are used for this purpose. Since the voltage drop is generally amplified by operational amplifiers or the like, an auxiliary power supply is also necessary, at least for the amplifier. Thus, in practice, it is necessary to accept significant complexity for the auxiliary power supply on the one hand and for the voltage decoupling on the other hand, for this purpose.

A linear current measurement circuit is known from DE 199 10 755 A1, especially for a motor circuit in which an input circuit which is at high voltage and has an amplifier and an A/D converter supplies a digital signal with a sequence of current pulses, which are converted back to an analog signal at ground potential.

Furthermore, FR 2 541 777 A discloses an apparatus for signal transmission by way of transformers between a primary section in the low-voltage range and a secondary section in the high-voltage range. A power supply is provided in the primary section, which transmits the energy which is required for operation of the secondary section by way of a transformer, in the form of power pulses from the primary section to the secondary section. In this case, the information is transmitted by the duty ratio of the periodic power pulse pauses.

SUMMARY OF THE INVENTION

An object of an embodiment of the invention is to minimize the technical complexity for current measurement at a potential.

In an embodiment of the invention, the measurement value, which is at high potential, is transferred to ground potential by modulation of its own power supply, which is at a high-voltage potential. The power supply for detection of the measurement signal and for the transmission of the measurement value are thus combined. The DC isolation which was still necessary until now can thus be avoided. In particular, this measure makes the solution according to an embodiment of the invention cheaper than the procedure according to the prior art.

An embodiment of the invention results in simultaneous use of the power supply for the unit for data transmission by modulation of the supply current. It is thus possible to carry out the measurement at high potential, and to transmit the measurement value as a modulated supply current.

An embodiment of the invention is particularly suitable for current measurement by use of a shunt which is at a potential. However, an embodiment of the invention can also be used for any other measurement tasks in which any desired measurement values are at a relatively high potential.

BRIEF DESCRIPTION OF THE DRAWINGS

Further details and advantages of the invention can be found in the following description of the figures with reference to the drawing and in conjunction with the patent claims. In the figures:

Identical units have the same reference symbols in the figures. Some of the figures are described jointly.

DETAILED DESCRIPTION OF THE PREFERRED EMBODIMENTS

Figure 1:
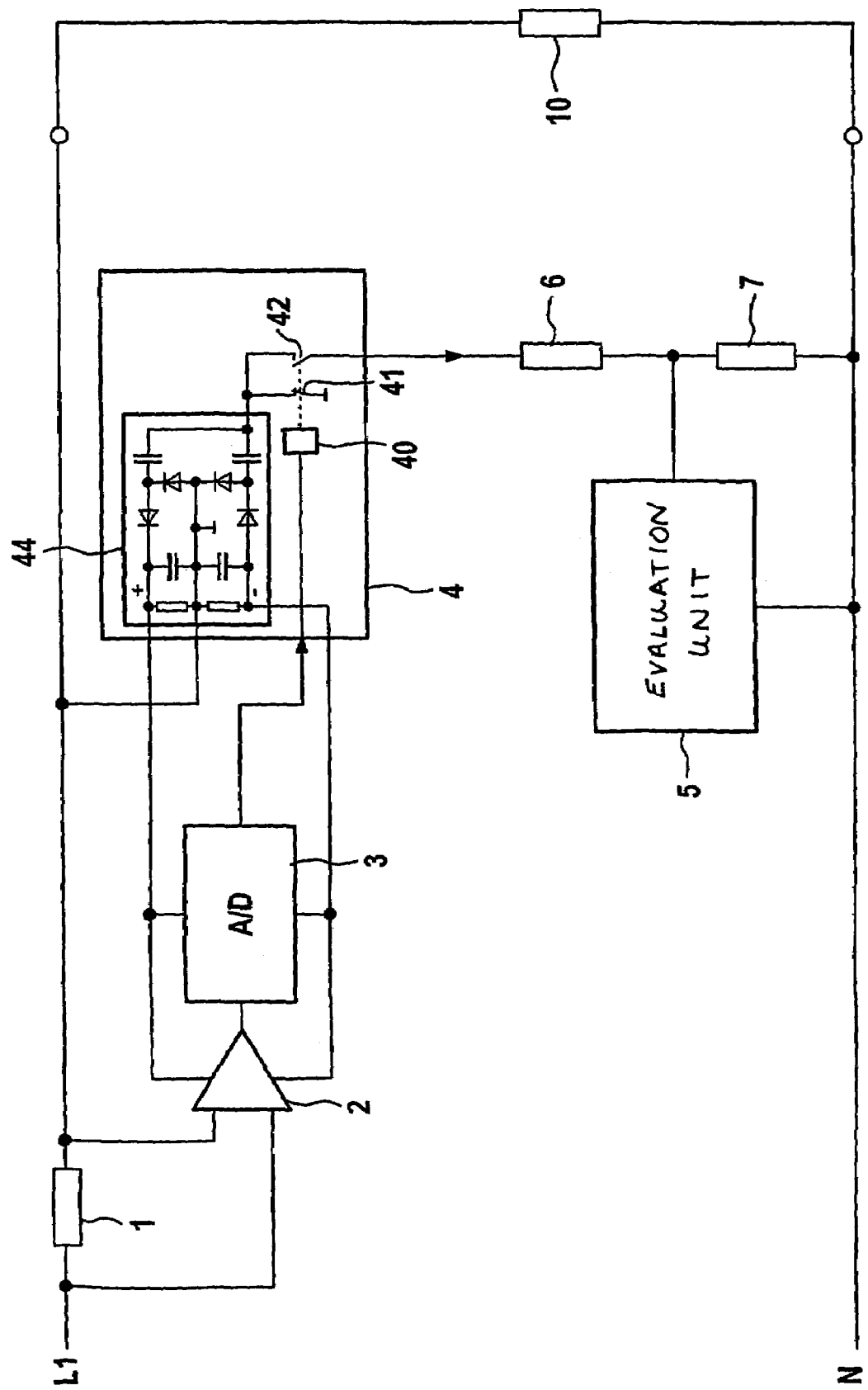
FIG. 1 shows the principle of a current measurement device, in which the measurement values are transmitted by modulation of its own power supply.

In the figures, L1 denotes a phase of a line which is at a potential. N denotes the neutral conductor at ground potential. A load 10 is connected to L1 and N. There may be two further phases L2 and L3 in an equivalent manner.

A shunt 1 with a resistance value $R_S$ is connected in the line L1 which is at a potential. The voltage U1 across the shunt 1 is tapped off and is supplied to an amplifier 2. The amplifier 2 is followed by an analog/digital (A/D) converter 3, which emits a digital signal.

The digital signal from the A/D converter 3 is used as a modulation clock for a modulation unit 4, which is also used for supplying power to the units 2 and 3. In order to produce a supply current, the modulation unit 4 is connected to the live lines, that is to say to the phase conductor L1 and to the neutral conductor N. In this example embodiment, a measurement signal may be transmitted in binary form, as a numeric value.

The supply current is now modulated by the modulation unit 4 and is passed via resistors 6 and 7 with resistance values $R_v$ and $R_m$ to the neutral conductor N, which is at ground potential. The resistors 6 and 7 are used as a voltage divider, with one branch being connected via the resistor 7 to an evaluation unit 5, which is at ground potential. The evaluation unit 5 is, for example, a microcontroller, via which the measurement value is emitted.

The supply current can be modulated for example by on/off keying in the modulation unit 4. A first switch 41 and a second switch 42, for example, are provided for this purpose and are expediently in the form of semiconductor switches. The two switches 41 and 42 are opened and closed in antiphase, with the operating frequency depending on the value of the measurement signal to be transmitted. For this purpose, the modulation unit 4 has a switch controller 40, which is driven by the A/D converter 3 and emits the antiphase switch signals to the switches 41 and 42.

The evaluation of the measurement value comprises a frequency measurement of the modulation clock. The clock signal is recovered via the voltage drop of the supply current, which is modulated with the measurement information, across the resistor 7, which has a defined resistance value $R_M$. A signal with the original measurement value is thus produced.

The modulation unit 4 also contains a power supply unit 44 with a rectifier circuit. The rectifier circuit, which is indicated symbolically in FIG. 1, produces an auxiliary current which supplies current to those components which are at a potential, in particular such as the amplifier 2 and the A/D converter 3.

Figure 2:
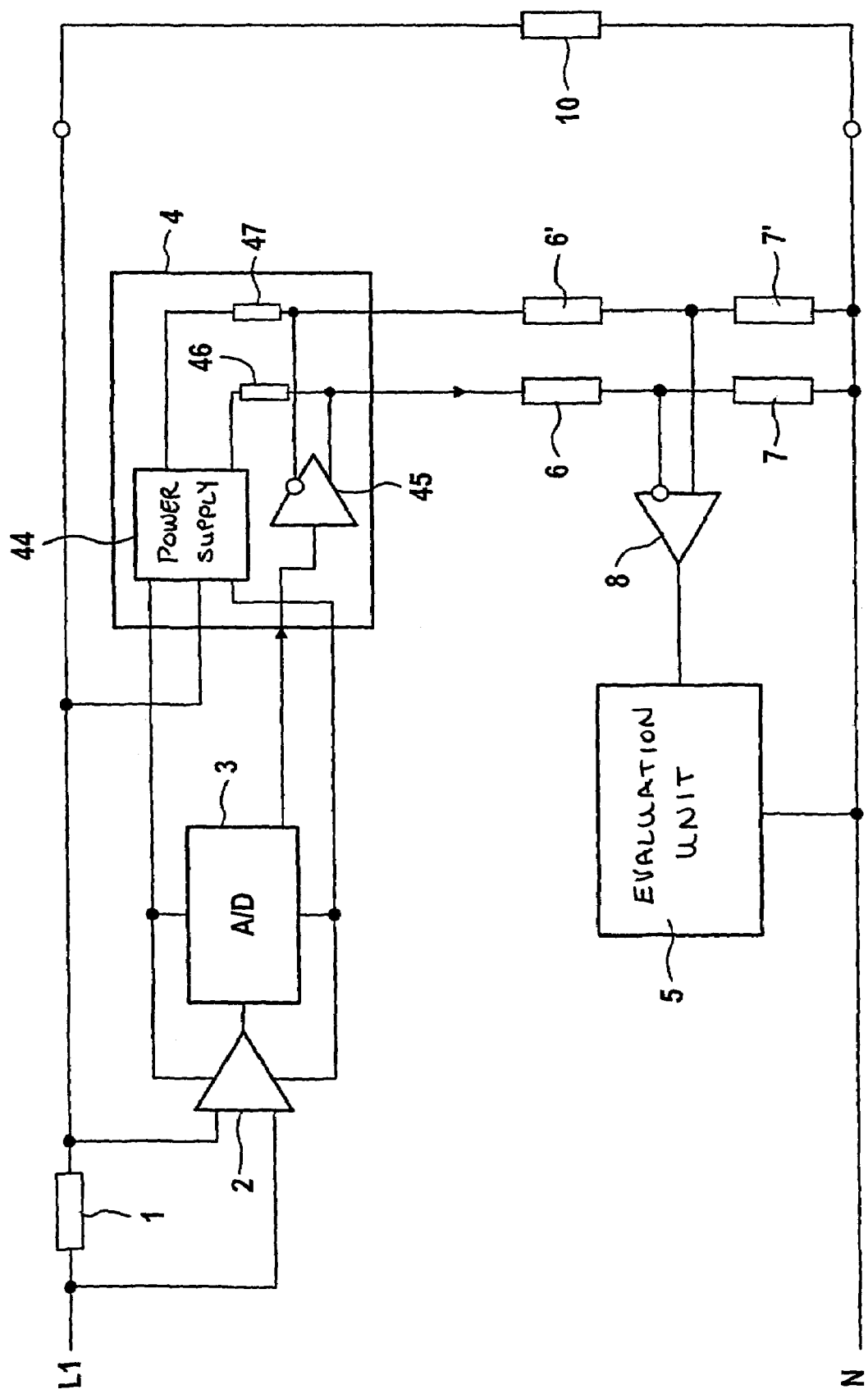
FIG. 2 shows a modification of FIG. 1, with differential modulation.

In FIG. 2, the arrangement shown in FIG. 1 has been modified for differential modulation of the measurement signals. To this end, there are two voltage dividers including the resistors 6, 7 and 6', 7' with respective resistance values $R_{v1}$, $R_{m1}$ and $R_{v2}$, $R_{m2}$, from which a difference value is passed via a differential amplifier 8 to the evaluation unit 5. Also, the modulation unit 4 may include resistors 46, 47 that may be driven by a modulation amplifier 45. However, apart from this, the modulation function remains the same.

The circuits which have been described with reference to the two exemplary embodiments make simultaneous use of the power supply as a unit for data transmission by the modulation of the supply current. It is thus possible in a simple manner to carry out the measurement at high potential and to transmit the measurement value in order to emit measurement values.

The described method is suitable for both DC and AC networks, in particular three-phase networks as well. In addition to use for current measurement, other applications are also possible, such as temperature measurements for devices which are at a potential. Devices such as these occur, for example, in motor vehicles, in which one pole of a load is connected by way of intelligent switches to the positive supply voltage, while the other pole is connected to ground. Information about the temperature is also transmitted in this case, as well as the current.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A method for evaluation of a measurement signal, in the form of an analog value at a potential higher than zero potential, in a measurement device which requires a supply current, and whose measurement information is transmitted after A/D conversion as a digital signal to an evaluation unit at ground potential, comprising:
   providing, after the A/D conversion of the measurement signal, the produced digital signal as a clock for modulation of the supply current, the digital signal further functioning as a carrier of information content of the measurement signal, wherein the supply current is drawn directly, without galvanic isolation, from the potential higher than zero potential.

2. The method as claimed in claim 1, wherein two current path elements of the supply current are modulated in antiphase.

3. The method as claimed in claim 2, wherein at least one of a frequency and period duration measurement of the supply current modulated with the measurement information is carried out for evaluation of the measurement signal.

4. The method as claimed in claim 3, wherein the clock of the digital signal, produced in the A/D converter, is recovered for evaluation of the modulated supply current.

5. The method as claimed in claim 1, wherein a modulation frequency depends on a value of the measurement signal to be transmitted.

6. The method as claimed in claim 5, wherein the measurement signal is transmitted in binary form, as a numerical value.

7. The method as claimed in claim 1, wherein at least one of a frequency and period duration measurement of the supply current modulated with the measurement information is carried out for evaluation of the measurement signal.

8. The method as claimed in claim 7, wherein the clock of the digital signal, produced in an A/D converter, is recovered for evaluation of the modulated supply current.

9. A circuit arrangement for carrying out the method as claimed in claim 1, for a current measurement on a shunt, wherein a voltage drop is evaluated as a measure of the current after amplification, comprising:
   a shunt;
   an amplifier, for a voltage signal which is tapped off across the shunt;
   an analog/digital converter; and
   a modulation unit for supplying current to measuring components, wherein the modulation unit includes a power supply unit for the measurement components and is at a high-voltage potential, whereby the power supply is galvanic connected through a galvanic line with resistors.

10. The circuit arrangement as claimed in claim 9, further comprising:
    at least one resistor; and
    an evaluation unit, associated with the at least one resistor and at ground potential, for the modulated supply current.

11. The circuit arrangement as claimed in claim 10, wherein the at least one resistor includes a further associated resistor, wherein defined resistance values of the at least two resistors act as a voltage divider.

12. The circuit arrangement as claimed in claim 11, wherein the at least two resistors with defined resistance values include two further resistors with defined resistance values, the at least four resistors acting as two voltage dividers for differential modulation.

13. The circuit arrangement as claimed in claim 12, wherein the voltages tapped off on the voltage dividers are passed via a differential amplifier to the evaluation unit.

14. The circuit arrangement as claimed in claim 11, wherein the voltages tapped off on the voltage divider are passed via a differential amplifier to the evaluation unit.

15. The circuit arrangement as claimed in claim 9, wherein the modulation unit includes two switches, adapted to operate in antiphase and including an associated switch controller.

16. The circuit arrangement as claimed in claim 9, wherein the modulation unit includes resistors, driven by a modulation amplifier.

17. The method as claimed in claim 1, further comprising:
transmitting the measurement information, after A/D conversion, as a digital signal to an evaluation unit at ground potential.

18. A method for evaluation of a measurement signal in a measurement device which requires a supply current, comprising:
providing, after A/D conversion of the measurement signal, the produced digital signal as a clock for modulation of the supply current, the digital signal further functioning as a carrier of information content of the measurement signal, wherein the supply current is drawn directly, without galvanic isolation, from a potential higher than zero potential.

19. The method as claimed in claim 18, wherein two current path elements of the supply current are modulated in antiphase.

20. The method as claimed in claim 18, wherein a modulation frequency depends on a value of the measurement signal.

21. The method as claimed in claim 20, further comprising:
transmitting the measurement signal in binary form, as a numerical value.

22. The method as claimed in claim 18, wherein at least one of a frequency and period duration measurement of the supply current modulated with the measurement information is carried out for evaluation of the measurement signal.

23. The method as claimed in claim 22, wherein the clock of the digital signal, produced in an A/D converter, is recovered for evaluation of the modulated supply current.

24. The method as claimed in claim 18, wherein the measurement signal is in the form of an analog value at a potential higher than zero potential.

25. A circuit arrangement for a current measurement on a shunt, wherein a voltage drop is evaluated as a measure of the current after amplification, comprising:
a shunt;
an amplifier, adapted to amplify a voltage signal tapped off across the shunt;
an analog/digital converter adapted to convert the amplified signal into a digital signal; and
a modulation unit, adapted to supply current to measuring components, wherein the modulation unit includes a power supply unit for the measurement components and wherein the modulation unit is at a high-voltage potential, wherein the digital signal is adapted to be used as a clock for modulation of the supply current and further functions as a carrier of information content of the measurement signal, wherein the power supply is galvanic connected through a galvanic line with resistors.

26. The circuit arrangement as claimed in claim 25, further comprising:
at least one resistor; and
an evaluation unit, associated with the at least one resistor and at ground potential, for the modulated supply current.

27. The circuit arrangement as claimed in claim 26, wherein the at least one resistor includes a further associated resistor, wherein defined resistance values of the at least two resistors act as a voltage divider.

28. The circuit arrangement as claimed in claim 27, wherein the at least two resistors with defined resistance values include two further resistors with defined resistance values, the at least four resistors acting as two voltage dividers for differential modulation.

29. The circuit arrangement as claimed in claim 27, wherein the voltages tapped off on the voltage divider are passed via a differential amplifier to the evaluation unit.

30. The circuit arrangement as claimed in claim 25, wherein the modulation unit includes two switches, adapted to operate in antiphase and including an associated switch controller.

31. The circuit arrangement as claimed in claim 25, wherein the modulation unit includes resistors, driven by a modulation amplifier.

\* \* \* \* \*